(12) United States Patent
Ruckerbauer et al.

(10) Patent No.: US 7,334,150 B2
(45) Date of Patent: Feb. 19, 2008

(54) MEMORY MODULE WITH A CLOCK SIGNAL REGENERATION CIRCUIT AND A REGISTER CIRCUIT FOR TEMPORARILY STORING THE INCOMING COMMAND AND ADDRESS SIGNALS

(75) Inventors: Hermann Ruckerbauer, Moos (DE); Abdallah Bacha, Munich (DE); Christian Sichert, Munich (DE); Dominique Savignac, Ismaning (DE); Peter Gregorius, Munich (DE); Paul Wallner, Prien (DE)

(73) Assignee: Infineon Technologies AG, Neubiberg (DE)

( * ) Notice: Subject to any disclaimer, the term of this patent is extended or adjusted under 35 U.S.C. 154(b) by 439 days.

(21) Appl. No.: 11/002,148

(22) Filed: Dec. 3, 2004

(65) Prior Publication Data

US 2006/0123265 A1    Jun. 8, 2006

(51) Int. Cl.
*G06F 1/04*    (2006.01)
(52) U.S. Cl. .................................. 713/500; 713/600
(58) Field of Classification Search ............... 713/500, 713/600; 365/223
See application file for complete search history.

(56) References Cited

U.S. PATENT DOCUMENTS

| 7,155,627 B2* | 12/2006 | Matsui ..................... 713/401 |
| 2002/0129215 A1 | 9/2002 | Yoo et al. |
| 2003/0221044 A1 | 11/2003 | Nishio |
| 2004/0100812 A1 | 5/2004 | Wu |

* cited by examiner

*Primary Examiner*—Chun Cao
(74) *Attorney, Agent, or Firm*—Edell, Shapiro & Finnan, LLC

(57) ABSTRACT

A semiconductor memory module includes a plurality of semiconductor memory chips and bus signal lines that supply an incoming clock signal and incoming command and address signals to the semiconductor memory chips. A clock signal regeneration circuit and a register circuit are arranged on the semiconductor memory module in a common chip packing connected to the bus signal lines. The clock signal regeneration circuit and the register circuit respectively condition the incoming clock signal and temporarily store the incoming command and address signals, respectively multiply the conditioned clock signal and the temporarily stored command and address signals by a factor of 1:X, and respectively supply to the semiconductor memory chips the conditioned clock signal and the temporarily stored command and address signals.

17 Claims, 5 Drawing Sheets

—/—/—/— CA signal lines
------- clock signal lines

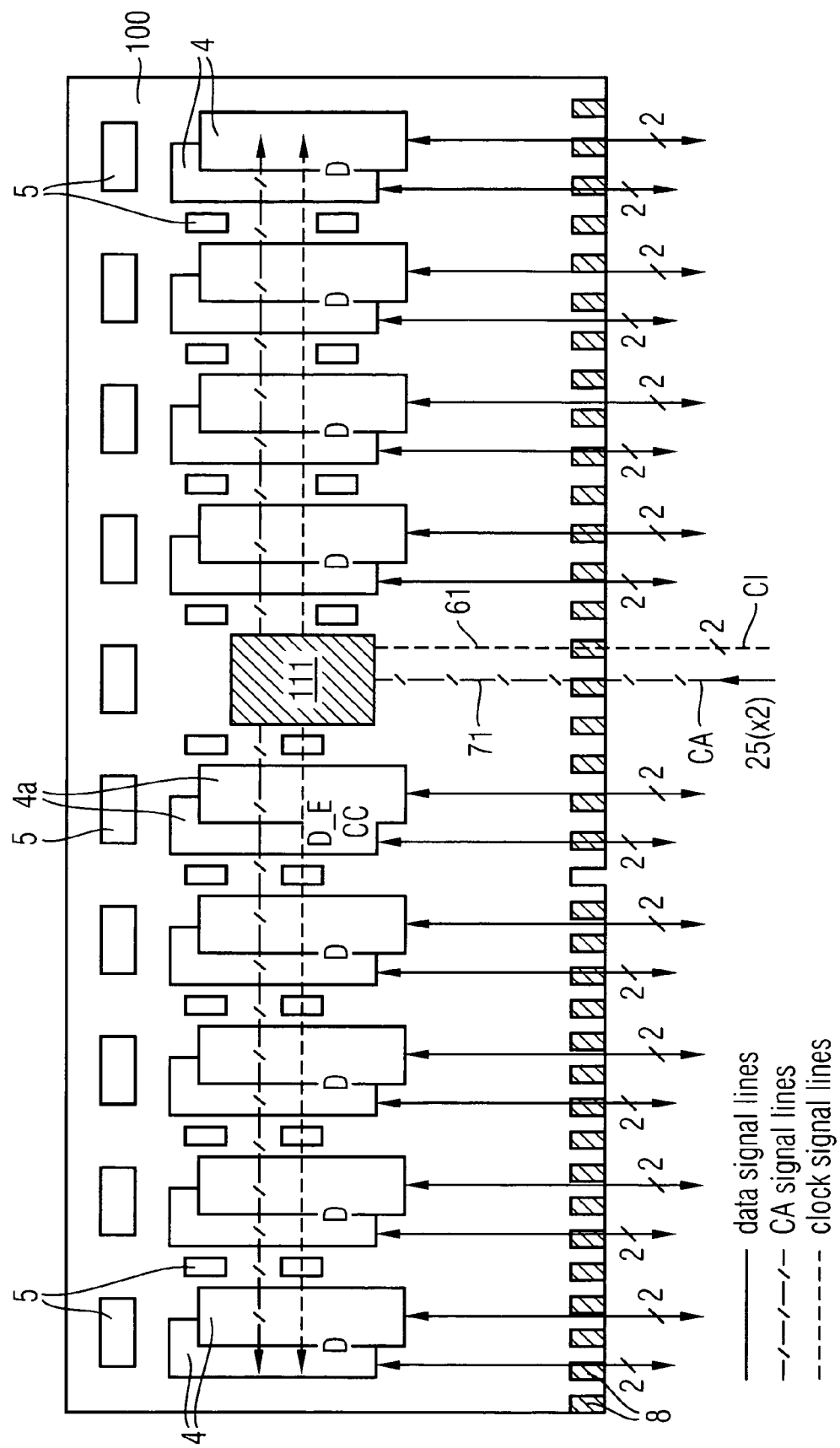

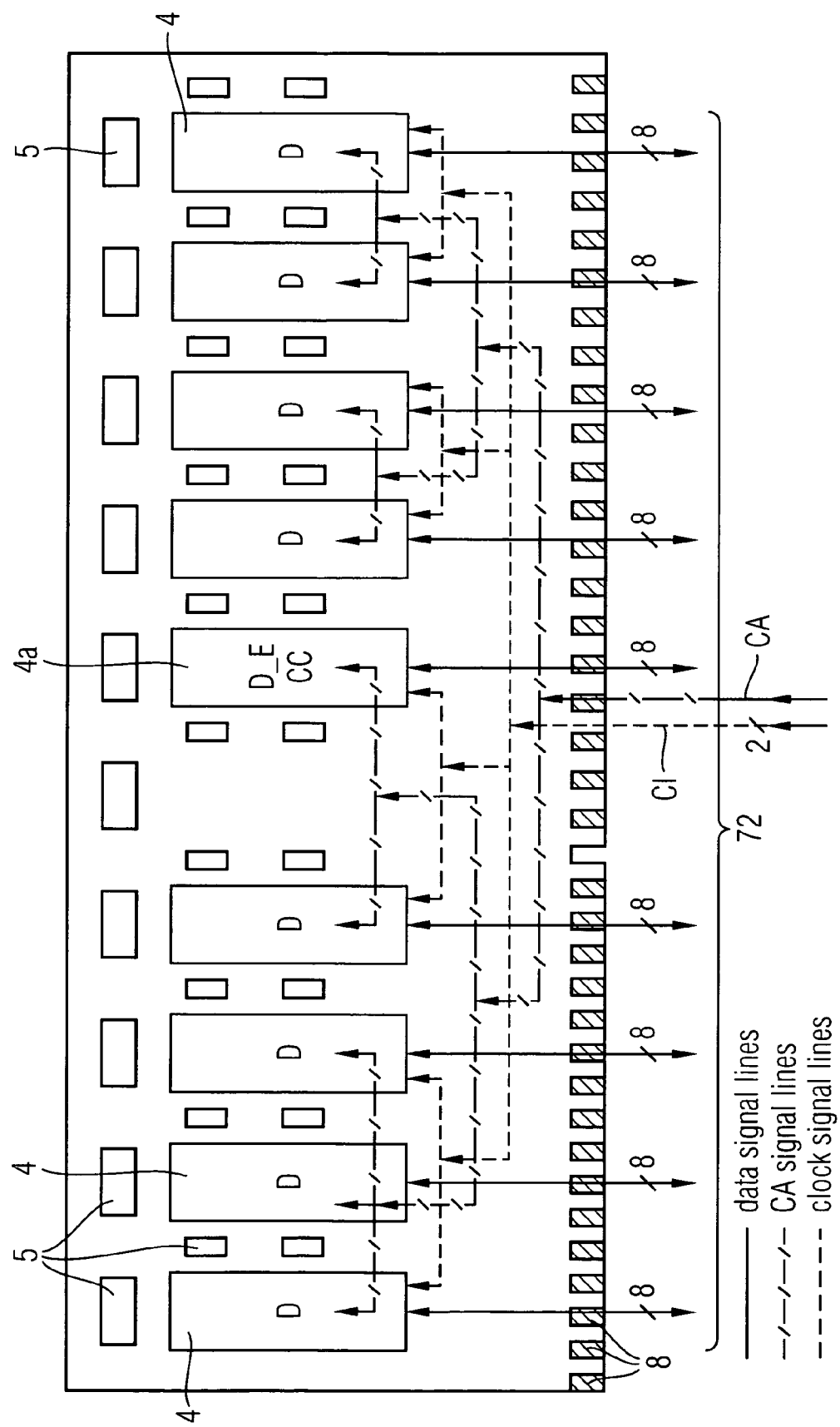

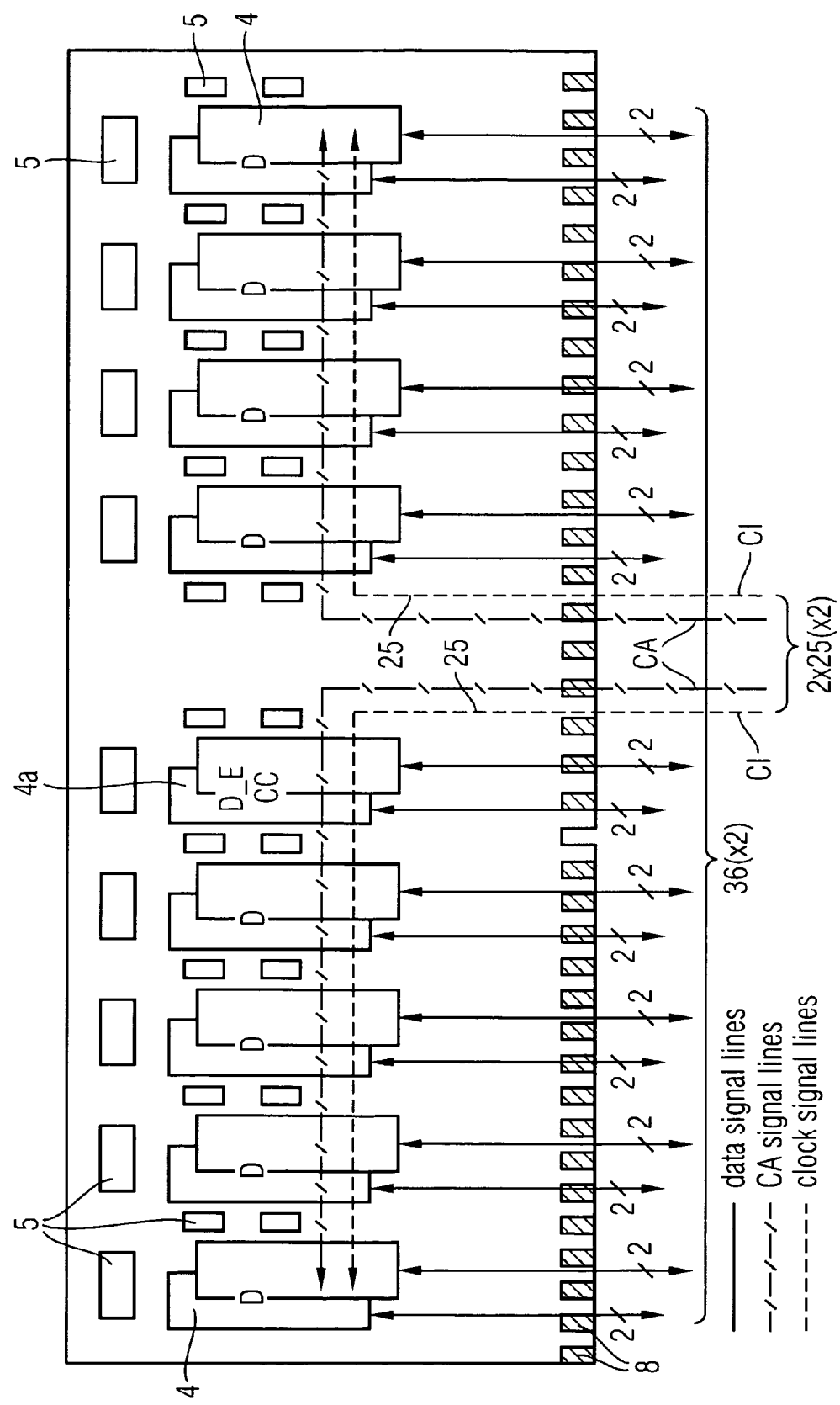

MEMORY MODULE WITH A CLOCK SIGNAL REGENERATION CIRCUIT AND A REGISTER CIRCUIT FOR TEMPORARILY STORING THE INCOMING COMMAND AND ADDRESS SIGNALS

FIELD OF THE INVENTION

The present invention relates to a semiconductor memory module, wherein several semiconductor memory chips and bus signal lines, each of which supplies an incoming clock signal as well as incoming command and address signals to at least the semiconductor memory chips, and a semiconductor circuit which comprises a buffer register circuit and a clock signal regeneration circuit are arranged on the semiconductor memory module.

BACKGROUND

Present memory systems (DDR1; DDR2; DDR3) provide the possibility of supplying the DIMM command/address bus transferring the command and address signals (CA) with only one version (copy) of the CA bus, for example via a hybrid-T or fly-by bus. With further increasing speeds and considering the high parallelism at the CA bus (for example up to 36 memory chips per CA bus), the conventional transfer of command and address signals is no longer possible.

A potential solution to the above-mentioned problem lies in using two copies of the CA bus. This, however, increases the pin number per memory channel (for example by 25 CA signals and the pins required for the necessary shielding). Because of the high bit rate on the data lines, a differential signal transfer is considered for successor technologies of the DDR3 system, for example for DDR4. For differential signal transfer, however, the number of pins required is distinctly higher, the implementation thereof being very difficult from a technical point of view (or causing high cost). This involves the pin number at the connector of the semiconductor memory module, the pin number at the memory controller and the routing on the motherboard.

Since, owing to the high bit rates of the successor technologies of the DDR system, only fly-by busses or point-to-point (P2P) busses will be possible, any clock signal required for synchronization must also be transferred differentially together with the CA signals.

The exemplary arrangement of DDR2 systems according to the state-of-the-art shown in the accompanying FIG. 4 is a schematic layout view of a DDR2 DIMM semiconductor memory module, wherein the CA signals CA coming from an external CA bus and the assigned clock signals Cl on the semiconductor circuit module are transferred to the DDR2 DIMM semiconductor memory module via a hybrid-T bus structure (the lines transferring the differential clock signals Cl are presented by broken lines and the lines transferring the differential CA signals are presented by dash-dotted lines). In the example, semiconductor memory chips 4 each storing eight data items D and an additional error correction chip (D-E-CC) 4a and additional passive components 5 are arranged on the DIMM semiconductor memory module. The data pertaining to the individual memory chips 4 and to the D-E-CC chip 4a is each transferred with a width of eight bits, thus being assigned to 72 connector locations or pin contacts 8 in case of this semiconductor module.

The accompanying FIG. 5 is an exemplary schematic view of a potential semiconductor memory module for the DDR4 system, wherein use is being made of two copies of the CA bus in accordance with the above-mentioned theoretical solution. In the example, the differentially supplied CA signals CA including the clock signals Cl require 25×2 (×2) connector locations or pin contacts 8 for a 2N timing. The lines required for shielding are also necessary. In the example shown in FIG. 5, the write and read data is supplied to each memory chip 4, 4a of the memory channel arranged to the left of the semiconductor memory module and of the memory channel arranged to the right of the semiconductor memory module with a width of two bits and differentially; this results in an X2-based DDR4 DIMM with 2N timing of the CA signals. In case of such a semiconductor memory module which comprises several memory channels or memory banks, the wide routing of the twice as many CA and Cl lines on the semiconductor memory module would limit the installation space for installing the passive components 5, such as decoupling capacitors, and the space for routing the data signal lines to the semiconductor memory chips to an excessive degree, not to mention the increased number of pins.

SUMMARY

Therefore, the present invention aims at specifying a semiconductor memory module suitable for high-speed semiconductor memory systems such that the above-mentioned drawbacks of the state-of-the-art can be obviated and that the CA and Cl signals are supplied to the semiconductor memory chips arranged on the semiconductor memory module in a space-saving and pin-contact-saving manner and that, at the same time, it is possible to reach the speeds required for transferring the CA and Cl signals. Furthermore, the invention aims at specifying a semiconductor circuit that comprises a clock signal regeneration circuit and a register circuit that are designed to match such a semiconductor memory module.

According to a first aspect of the invention, there is provided a semiconductor memory module comprising a clock signal regeneration circuit and a register circuit arranged on the semiconductor memory module in a common chip packing and connected to bus signal lines, in order to condition the incoming clock signal and to temporarily store the incoming command and address signals and to supply the conditioned clock signal and the temporarily stored command and address signals to semiconductor memory chips after being multiplied by a factor of 1:X.

By using a clock signal regeneration circuit and a register circuit that are commonly accommodated in one chip packing in the manner described above to achieve a multiplication of CA and synchronizing clock signals by a factor of 1:X, it is possible to reach the speeds required for future memory technologies and, at the same time, save installation space and pin contacts on the semiconductor memory module. The combination of register circuit and clock signal regeneration circuit in a common chip packing allows supplying a complete semiconductor memory module (DIMM) with one CA copy from the memory controller. Since the CA signals are multiplied by a factor of 1:X, several CA copies can be provided to several DRAM branches or channels by local generation in the combined clock signal regeneration and register circuit (since, owing to the high bit rates, the higher-speed DDR memory systems succeeding the DDR3 system will facilitate only a fly-by bus structure or a point-to-point bus structure, it is also necessary that an associated clock signal required for synchronization be also conditioned on the semiconductor memory module and transmitted together with the CA signals).

By combining the register circuit with the clock signal regeneration circuit in a common chip packing, as is proposed according to the invention, the operating temperature of the clock signal regeneration circuit is, in addition, lowered. Should the clock signal regeneration circuit be provided as a single chip packing (separated from the register circuit), the operating temperature would significantly exceed the temperature of the memory chips and would increase with the number of loads the clock signal regeneration circuit has to drive. Thus, the combination of the clock signal regeneration circuit with the register circuit proposed by the invention allows an improved distribution of the heat generated by the clock signal regeneration circuit. The combination according to the invention of the clock signal regeneration circuit and the register circuit in a common chip packing causes the operating temperature of the common chip packing to drop to the temperature level of the semiconductor memory chip. Hence, the semiconductor memory module according to the invention, comprising the clock signal regeneration circuit that is accommodated in a common chip packing together with the register circuit, is of particular advantage when used in very densely packed semiconductor memory modules, for example in DIMM semiconductor memory modules that are fitted with several DDR-DRAM chips of the DDR systems succeeding the DDR3 system, because the module space saved through the routing of the CA signals can be used for the passive and active components in case of semiconductor modules that are fitted with such a high component density.

Preferably, the clock signal regeneration circuit comprises a phase locked loop (PLL) circuit. As previously mentioned, the clock signal and the clock signal conditioned by the clock signal regeneration circuit are each supplied via differential clock signal lines in case of the planned high-speed memory systems.

In one embodiment of the semiconductor memory module according to the invention, the clock signal regeneration circuit and the register circuit are arranged as separate partial chips (dies) in the common packing. These partial chips may, for example, be stacked in the chip packing.

By supplying the clock signal conditioned by the clock signal regeneration circuit to the register circuit inside the chip packing, the space required for these differential clock signal lines on the semiconductor memory module is advantageously reduced.

According to another embodiment of the semiconductor memory module of the invention, the clock signal regeneration circuit and the register circuit are integrated on one common chip (die) in the packing. This second embodiment is advantageous in that the chip area of the common clock signal regeneration and register circuit is reduced.

Preferably, the chip packing containing the clock signal regeneration circuit and the register circuit is essentially arranged at a central position on the semiconductor circuit module.

In the semiconductor circuit module according to the invention, the bus lines of the command and address signals including the signal lines for the clock signal that is also transferred, preferably (but not necessarily) form a fly-by bus structure.

The register and clock signal regeneration circuits are, preferably, designed such that they each multiply the clock signal and the command and address signal by a factor of 1:2.

In one embodiment, the semiconductor memory module can be an RDIMM module and can be fitted with DDR-DRAM semiconductor memory chips.

BRIEF DESCRIPTION OF THE DRAWINGS

The above and further advantageous elements of a semiconductor memory module according to the invention as well as of an appropriate semiconductor circuit comprising a clock signal regeneration circuit and a register circuit are illustrated in more detail in the following description, with reference being made to the accompanying drawing, wherein:

FIG. 3 is a schematic layout view of a second embodiment of a semiconductor memory module according to the invention;

FIG. 4 is a schematic layout view of the afore described semiconductor memory module with hybrid-T bus structure for the clock signal and command and address signal lines; and FIG. 5 is a schematic layout view of the afore described semiconductor memory module with fly-by bus structure with two copies of the clock signal and command and address signal bus.

DETAILED DESCRIPTION

Figure 1:
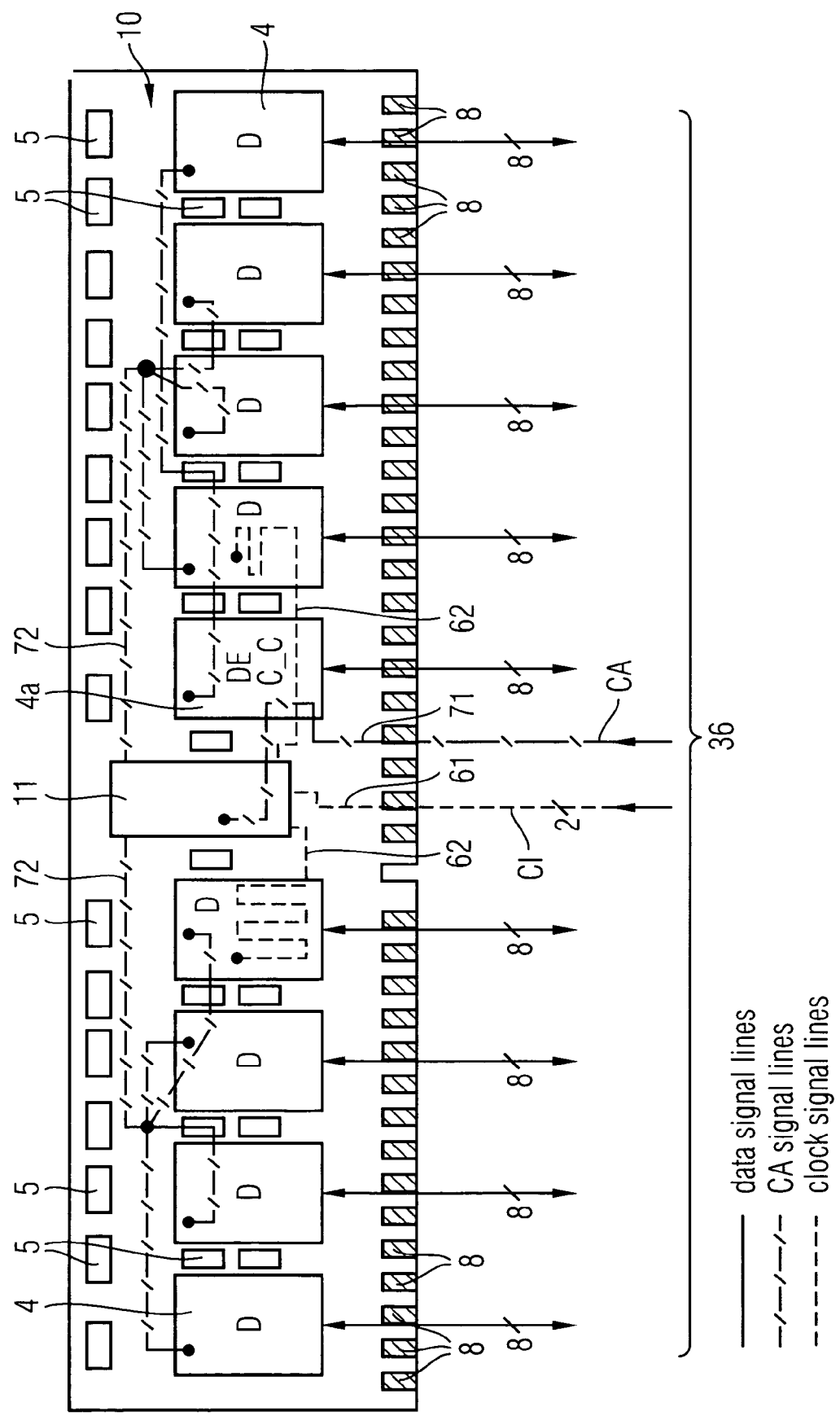
FIG. 1 is a schematic layout view of a first embodiment of a semiconductor memory module according to the invention.
Figure 2:
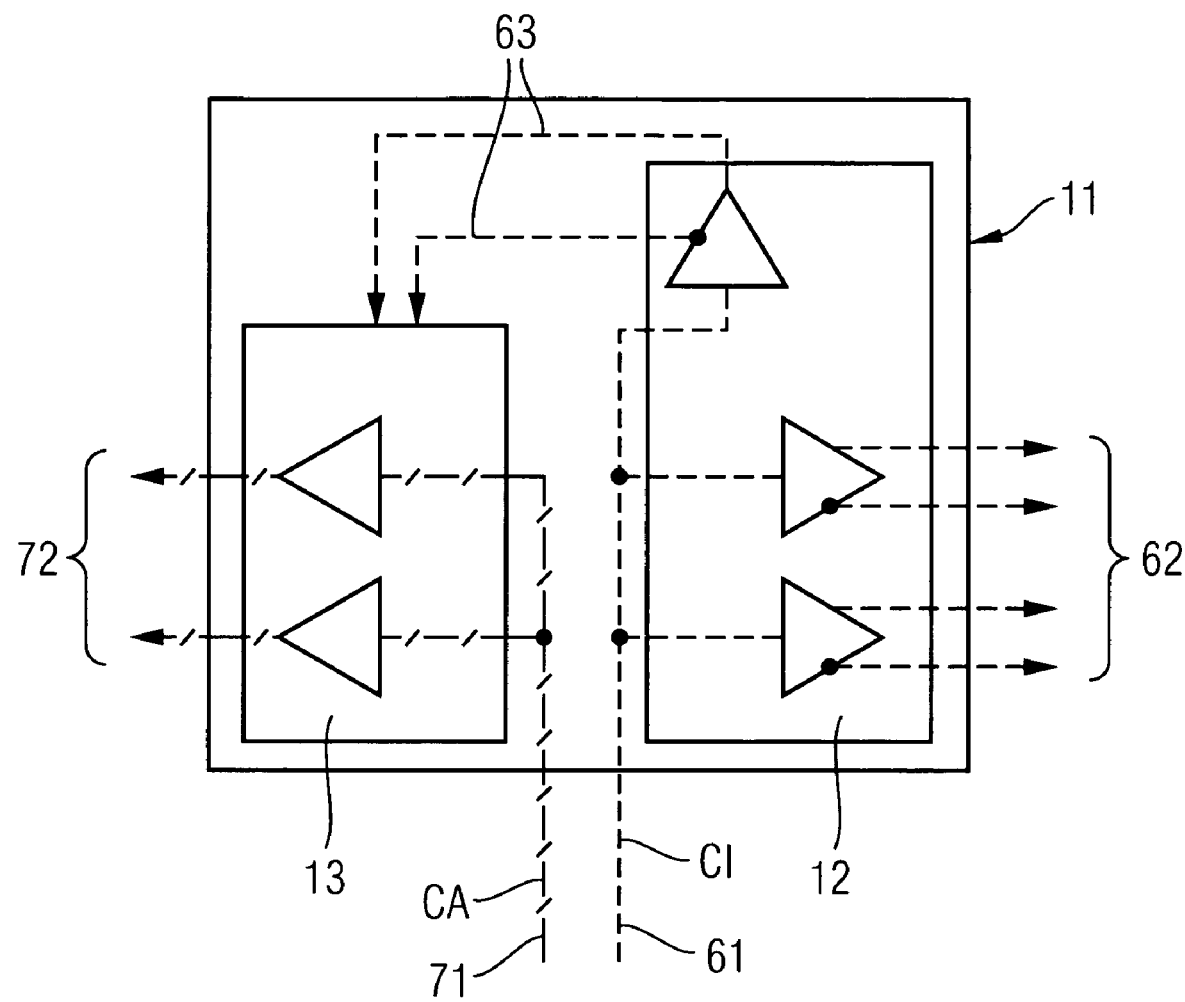
FIG. 2 is a schematic top view of the clock signal regeneration circuit and register circuit in a common chip packing according to a first executive example.

In the first embodiment of the invention which is schematically shown in FIG. 1, a chip packing 11 (shown in detail in FIG. 2) that contains a clock signal regeneration circuit 12 together with a register circuit 13 is arranged on the semiconductor memory module 10, an RDIMM module in this example, which is fitted with DDR-DRAM chips 4 each storing eight data items D and a further DDR-DRAM chip 4a for error correction (DE_CC), at an approximately central position on the semiconductor memory module 10. External to the semiconductor memory module 10, 8-bit-wide data line sections supply write and read data to the DDR-DRAM chips 4 and 4a. From pin contacts 8, differential clock signal input lines 61 supply a clock signal Cl to the common chip packing 11, and a line section 71 with a specific bit width supplies the command and address input signals CA, also from pin contacts 8 to the common chip packing 11. It can be seen in FIG. 2 that, in this example, the clock signal regeneration circuit 12 and the register circuit 13 multiply the clock signals 61 and the CA signals 71 by a factor of 1:2 for the command and address signals. Starting at the clock signal regeneration circuit 12 which is, for example, a phase locked loop (PLL) circuit, differential clock signal lines 62 supply the conditioned clock signal to all of the memory chips 4, 4a, each to the left and the right of the module 10. In addition, differential clock signal lines 63 in the common chip packing 11 supply the conditioned clock signal to the register circuit 13, as shown in FIG. 2. From the register circuit 13, temporarily stored (buffered) command and address signals run via differential command and address signal lines 72 on the semiconductor memory module to the semiconductor memory chips 4, 4a, each to the left and the right of the semiconductor memory module 10.

The solution proposed according to the invention and comprising the operation of accommodating the clock signal regeneration circuit and the register circuit 13 in a common chip packing 11 is advantageous in that space is saved on the semiconductor memory module 10, this space saving being increasingly important the more semiconductor memory chips 4 are arranged on the semiconductor memory module 10.

By accommodating the clock signal regeneration circuit 12 and the register circuit 13 in a common chip packing 11, the temperature of the clock signal regeneration circuit 12 will, during operation, assume approximately the same value as the temperature of the semiconductor memory chips 4, 4*a*.

A comparison of the bus structure with that of the semiconductor memory module already described above in connection with FIG. 4 shows that the first embodiment of the semiconductor memory module 10 according to the invention also implements a hybrid-T bus structure for the clock signal lines and the CA signal lines.

In a first executive example, the clock signal regeneration circuit 12 and the register circuit 13 can be arranged in the common chip packing 11 according to FIG. 2, i.e., either next to each other as separate partial chips (dies) or stacked one above the other as separate partial chips (dies) in a space-saving manner (not shown in FIG. 2).

The accompanying FIG. 3 shows a schematic layout view of a second embodiment of a semiconductor memory module 100 according to the invention. In case of this second embodiment, the semiconductor memory chips 4, 4*a* that are arranged on the semiconductor memory module 100 form a DDR4-DIMM module based on a x2 data structure (as shown) or a x4 data structure (not shown). A common chip packing 111 which is arranged at an approximately central position on the semiconductor memory module 100, as was the case in the first embodiment according to FIG. 1, accommodates a clock signal regeneration circuit 12 and an address and command signal register circuit 13, each for multiplying a clock signal Cl supplied via differential clock signal input lines 61 by a factor of 1:2 as well as for temporarily storing/buffering and multiplying command and address signals CA that are supplied to the module 100 via CA lines 71 by a factor of 1:2. In the second embodiment of the semiconductor memory module 100 shown in FIG. 3, the differential command and address signals CA are supplied via the input CA lines 71 and the differential clock signal Cl and via the differential clock signal input lines 61 by means of a fly-by or point-to-point bus structure, because a fly-by bus or point-to-point (P2P) bus is the only bus structure that is possible with the high bit rates of the DDR systems succeeding the DDR3 system. In the second embodiment of the semiconductor memory module 100 shown in FIG. 3, the timing of the CA signals CA through the clock signals Cl is achieved by means of 1N timing, this, however, not limiting the scope of the present invention.

In the second embodiment shown in FIG. 3, the clock signal conditioning and command and address signal register circuits accommodated in the common chip packing 111 each multiply the CA signals CA and the clock signals Cl by a factor of 1:2 by supplying, via differential clock signal lines, the clock signals Cl conditioned by the clock signal conditioning circuit in the common chip packing 111 to the semiconductor memory chips 4, 4*a* that are each arranged to the left and the right of the semiconductor memory module 100. The same applies to the temporarily stored/buffered CA signals.

In general, the invention proposes to arrange on the semiconductor memory module a clock signal regeneration circuit and a register circuit in a common chip packing and to connect them to the bus signal lines 61, 71 supplying the command address signals CA and the clock signal Cl such that the incoming clock signal Cl is conditioned and the incoming command and address signals CA are temporarily stored, in order to multiply these signals by a factor of 1:X and to supply the conditioned clock signal Cl and the temporarily stored command and address signals CA to X semiconductor memory chip groups that are arranged on the semiconductor memory module. Although only two semiconductor memory chip groups are provided in the two embodiments of the semiconductor memory module 10 and 100 shown as examples in FIGS. 1 and 3, those skilled in the art will immediately see that it is also possible to arrange more than two semiconductor memory chip groups or DRAM branches on the semiconductor memory module, which can then be activated by means of the clock signals and command and address signals that are multiplied by a factor of 1:X by the clock signal conditioning circuit and the command and address signal register circuit. This allows supplying a complete DIMM with only one CA copy from a memory controller (not shown). By the CA and Cl signals being multiplied by a factor of 1:X, several DRAM groups can be supplied by means of the local generation of several CA and Cl copies. The drawback of the double pin number of the pin contacts 8, an element that is characteristic of the semiconductor memory module shown in FIG. 5 where two copies of the CA bus signals and the Cl bus signals must be supplied, has been obviated in the embodiments of the invention that have been described above in connection with FIGS. 1-3. Furthermore, the high speeds required for future memory technologies can be reached by using a combined clock signal conditioning and register circuit 11, 111 for multiplying the CA signals and clock signals by a factor of 1:X, as is proposed according to the invention.

The clock signal conditioning circuit and the register circuit can be arranged either next to each other as separate partial chips, as is shown in FIG. 2, or stacked one above the other as separate partial chips. An alternative proposed by the invention provides that the two functionalities of the clock signal conditioning circuit and the register circuit are integrated on a common chip (combined die).

Having described preferred embodiments of a new and improved semiconductor memory module, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

LIST OF REFERENCE SYMBOLS

4, 4*a* Semiconductor memory chips
5 Passive components
8 Pin contacts
10, 100 Semiconductor memory module
11, 111 Common chip packing
12 Clock signal regeneration circuit
13 Register circuit
61, 62, 63 Differential clock signal lines
71, 72 Command and address signal lines
CA Command and address signals
Cl Clock signal
D Data memory chips
DE_C_C Error correction data memory

What is claimed is:

1. A memory module, comprising:
   a plurality of memory chips arranged on the memory module;
   a plurality of bus signal lines operable to supply an incoming clock signal and incoming command and address signals to at least the memory chips;
   a clock signal regeneration circuit configured to generate a plurality of copies of the incoming clock signal and to supply the copies of the incoming clock signal to the memory chips, the copies of the incoming clock signal having a same frequency as the incoming clock signal; and
   a register circuit arrange on the memory module in a common chip packing with the clock regeneration circuit and configured to receive one of the copies of the incoming clock signal from the clock regeneration circuit, the register circuit being further configured to temporarily store the incoming command and address signals and to generate a plurality of copies of the incoming command and address signals and supply the copies of the incoming command and address signals to the memory chips, the copies of the incoming command and address signals having a same frequency as the incoming command and address signals.

2. The memory module according to claim 1, wherein the clock signal regeneration circuit comprises a phase locked loop (PLL) circuit.

3. The memory module according to claim 1, wherein the incoming clock signal and the copies of the incoming clock signal are each supplied via differential clock signal lines.

4. The memory module according to claim 1, wherein the clock signal regeneration circuit and the register circuit are arranged as separate partial chips in the common chip packing.

5. The memory module according to claim 1, wherein the clock signal regeneration circuit and the register circuit are integrated on a common chip in the common chip packing.

6. The memory module according to claim 1, wherein the common chip packing is arranged essentially at a central position on the memory module.

7. The memory module according to claim 1, wherein the bus signal lines of the command and address signals comprise a hybrid-T bus structure.

8. The memory module according to claim 1, wherein the bus signal lines of the command and address signals comprise a fly-by bus structure.

9. The memory module according to claim 1, wherein the clock signal regeneration circuit and the register circuit respectively generate two copies of the clock signal and the command and address signals for distribution to the memory chips.

10. The memory module according to claim 1, wherein the memory module comprises an RDIMM module.

11. The memory module according to claim 1, wherein the memory chips comprise DDR-DRAM memories.

12. An integrated circuit, comprising:
    a clock signal regeneration circuit configured to generate a plurality of copies of a clock signal, wherein the copies of the clock signal have a same frequency as the clock signal; and
    a register circuit arranged in a common chip packing with the clock signal regeneration circuit and configured to temporarily store incoming command and address signals and to generate a plurality of copies of the incoming command and address signals, wherein the copies of the incoming command and address signals have a same frequency as the incoming command and address signals, and
    wherein the clock signal regeneration circuit supplies one of the copies of the clock signal to the register circuit.

13. The integrated circuit according to claim 12, wherein the clock signal regeneration circuit comprises a phase locked loop (PLL) circuit.

14. The integrated circuit according to claim 13, wherein the clock signal regeneration circuit supplies the clock signal as a differential clock signals on differential clock signal lines.

15. The integrated circuit according to claim 14, wherein the clock signal regeneration circuit and the register circuit are arranged as separate partial chips in the common chip packing.

16. The integrated circuit according to claim 14, wherein the clock signal regeneration circuit and the register circuit are integrated on a common chip in the common chip packing.

17. The integrated circuit according to claim 12, wherein the clock signal regeneration circuit and the register circuit respectively generate two copies of the clock signal and the command and address signals for distribution external to the common chip packing.

* * * * *